United States Patent
Yang et al.

(10) Patent No.: US 6,827,835 B2
(45) Date of Patent: Dec. 7, 2004

(54) METHOD FOR ELECTROPLATED METAL ANNEALING PROCESS

(75) Inventors: Neng-Hui Yang, Hsin-Chu (TW); Kuo Feng Huang, Chu-Pei (TW); Tsung-Tang Hsieh, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 227 days.

(21) Appl. No.: 10/105,313

(22) Filed: Mar. 26, 2002

(65) Prior Publication Data

US 2003/0183308 A1 Oct. 2, 2003

(51) Int. Cl.$^7$ .................................................. C25D 5/48
(52) U.S. Cl. ...................... 205/220; 205/157; 205/225; 427/533; 438/758
(58) Field of Search .................................. 205/220, 224, 205/157; 438/758; 427/533

(56) References Cited

U.S. PATENT DOCUMENTS

2003/0162392 A1 * 8/2003 Wang et al. ................. 205/157

* cited by examiner

Primary Examiner—Robert R. Koehler
(74) Attorney, Agent, or Firm—Dickinson Wright PLLC

(57) ABSTRACT

A method for electroplated metal annealing process. First, a semiconductor structure is provided, wherein the semiconductor structure has a plurality of semiconductor components, such as a gate electrode, a source region and a drain region, and a field oxide region. Second, a dielectric layer is formed over the semiconductor structure, and a via which exposes a part of the semiconductor structure is formed in the dielectric layer by the use of conventional lithographic and etching processes and an electroplated metal layer is formed over the dielectric layer; meanwhile, the via is filled with the electroplated metal layer. The electroplated metal layer is then annealed by a $NH_3$ plasma process performed by plasma enhanced chemical vapor deposition (PECVD).

23 Claims, 2 Drawing Sheets

METHOD FOR ELECTROPLATED METAL ANNEALING PROCESS

BACKGROUND OF THE INVENTION

1. Field of the Invention

The present invention relates to a method for electroplated metal annealing process, and more particularly, to a method for electroplated copper annealing process.

2. Description of the Prior Art

As is well known to those skilled in the art, the RC delay of interconnects would limit the device high-speed performance while the dimensions of ULSI devices continue to shrink. The implementation of Cu (resistivity 1.7 m$\Omega$-cm) can effectively address this issue. Moreover, low fabrication cost and good reliability are some of the key reasons for replacing Al metallization by Cu. Electroplating is the preferred deposition method for Cu metallization due to its low capital cost, high throughput, excellent filling capability, good electrical characteristics and compatibility with low K materials. The room-temperature self-annealing behavior of electroplated (ECP) copper and its impact on device manufacturing have led to investigation of a post ECP annealing process to stabilize copper film properties before chemical mechanical polishing (CMP). The re-crystallization behavior would lead to a maximum sheet resistance drop of approximately 18~20% for 1 micron ECP Cu film before stabilizing. In addition, the self-annealing phenomenon causes an increased CMP polishing rate of ECP Cu films as a result to drop in film hardness. Therefore, a thermal anneal process is an essential step to stabilize the electroplated Cu films before CMP.

Post ECP Cu annealing process is generally done in a batch process using a furnace where typical annealing time is 30 minutes at elevated temperatures such as 350° C. in a vacuum or $N_2$ atmosphere. FIG. 1 is a schematic view showing the structure of the electroplated copper, a large number of hillock defects 102 were found in the electroplated copper lattice 101 after high temperature post-ECP annealing. Currently, low temperature annealing process (<200° C.) is a trend to suppress such hillock defects. However, after CMP, enormous hillock defects still appear after Cu barrier layer deposition and become large as follow-up dielectric film deposition in the damascene process.

Therefore, in order to overcome the above-mentioned defects, there is a need to develop new methods to solve the problems.

SUMMARY OF THE INVENTION

In accordance with the present invention, a method is provided for electroplated metal annealing process that substantially overcomes the above-mentioned defects which arise from conventional methods.

Accordingly, it is an object of the present invention to provide a novel method for an electroplated metal annealing process by replacing the conventional furnace post-ECP Cu annealing process with a $NH_3$ plasma process.

It is another object of this invention to provide a method for suppressing the formation of hillock type defects in the electroplated copper by using the high temperature $NH_3$ plasma to effectively release the stress in the electroplated copper.

It is an object of the present invention to provide a method for reducing the post-CMP defects such as pullouts and line voids.

In accordance with the above-mentioned objects, the present invention relates to providing a method for electroplated metal annealing process. First, a semiconductor structure is provided, wherein the semiconductor structure has a plurality of semiconductor components, such as a gate electrode, a source region and a drain region, and a field oxide region. Second, a dielectric layer is formed over the semiconductor structure, and a via which exposes a part of the semiconductor structure is formed in the dielectric layer by the use of the conventional lithographic and etching process, and an electroplated metal layer is formed over the dielectric layer; meanwhile, the via is filled with the electroplated metal layer. The electroplated metal layer then is annealed by a $NH_3$ plasma-enhanced chemical vapor deposition process. By the use of implementing a $NH_3$ plasma annealing process to replace a conventional furnace ECP post annealing process, it can effectively suppress the formation of hillock type defects due to the reduction in the stress in the copper layer, which could reduce the occurrence of defects such as pullouts and line voids in the following-up step. Meanwhile, the method could eliminate the re-formation of hillock type defects in the following barrier layer depositions, and it is a faster and more economical process for electroplated copper annealing due to the fact that the key operation time of the process is only about 30 seconds to 300 seconds, which is much less than the time of the conventional furnace ECP post-annealing process (30 minutes).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

Table 1 shows the respective copper layer properties of different Cu annealing process.

DESCRIPTION OF THE PREFERRED EMBODIMENT

Some embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

The present invention relates to a method for electroplated metal annealing process, which provides a semiconductor structure, such as a monocrystalline silicon, wherein composite semiconductor components have been formed in and on the semiconductor structure, such as a gate electrode, a source region and a drain region, and a field oxide region. Second, a dielectric layer is formed over the semiconductor structure. The material of the dielectric layer maybe one of SiO₂ TEOS (TetraEthyl-OrthoSilicate) and BPSG (BoroPhosphoSilicate Glass), or the like. After that, a via which exposes a part of the semiconductor structure is formed in the dielectric layer by the use of the conventional lithographic and etching process, and an electroplated metal layer is formed over the dielectric layer; meanwhile, the via is filled with the electroplated metal layer. The electroplated metal layer then is annealed by a $NH_3$ plasma process performed by PECVD (plasma enhanced chemical vapor deposition). The $NH_3$ plasma process is performed by a plasma enhanced chemical vapor deposition (PECVD) or a high density plasma chemical vapor deposition (HDPCVD) at about 350° C. to 450° C., and the HFRF power of the $NH_3$ plasma is about from 0.1 w/cm² to 5 w/cm², the LFRF power is about 0.05 w/cm² to 0.5 w/cm², the pressure is at about 0.1 Torr to 10 Torr, and the operation is about 30 seconds to 300 seconds.

Figure 3:
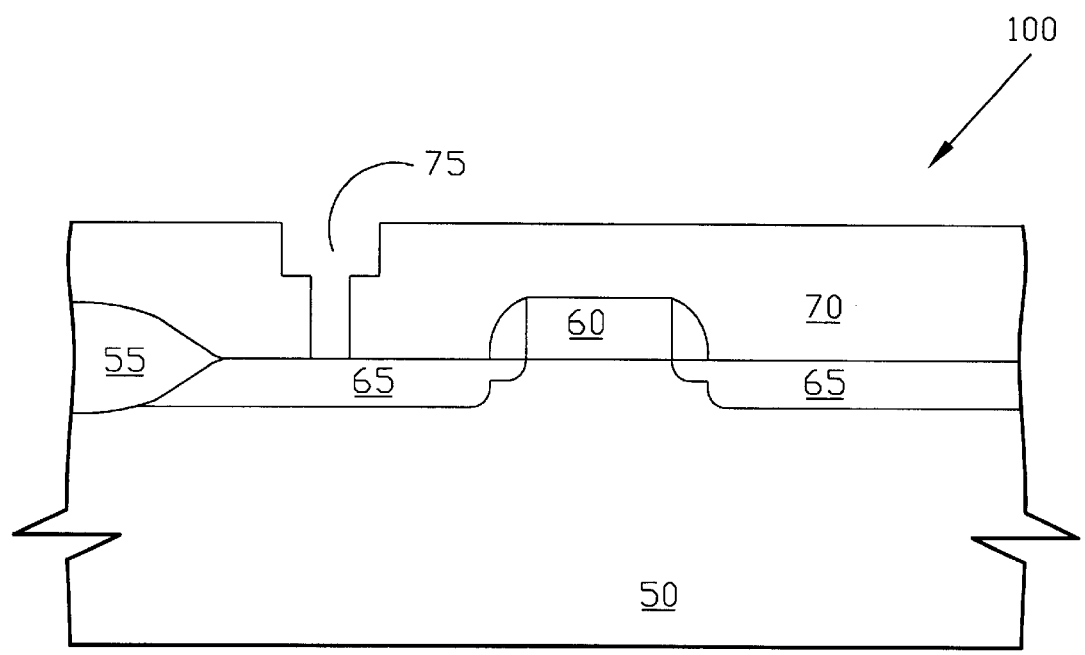
FIG. 3 is a cross-section view showing a semiconductor substrate with a plurality semiconductor device structures of the present invention.

Reference is now made to FIG. 3, which is a cross-section view of a semiconductor structure. The semiconductor structure 100 is preferably composed of monocrystalline silicon, which may comprise a local oxidation of silicon (LOCOS) 55 or a shallow trench isolation (STI), a drain region 64 and a source region 65, and a gate electrode 60 and a dielectric layer 70 are formed on the semiconductor structure 100, typically composed of silicon dioxide, white silicon dioxde, is deposited over the semiconductor structures 100 to a thickness of about 4000 to 10,000 Angstroms. Then, using the conventional lithography and etching techniques, a via 75 is formed through the SiO₂ layer 70 to the semiconductor structures 100 to be contacted, such as source region 64.

Typically, a composite barrier metal layer such as TaN, 100 Angstroms, Ta, 400 Angstroms, Cu, 1500 Angstroms, is deposited into the via 75 in turn by using plasma vapor deposition (PVD) to increase the adhesive ability of the follow-up electroplated metal layer.

Figure 4:
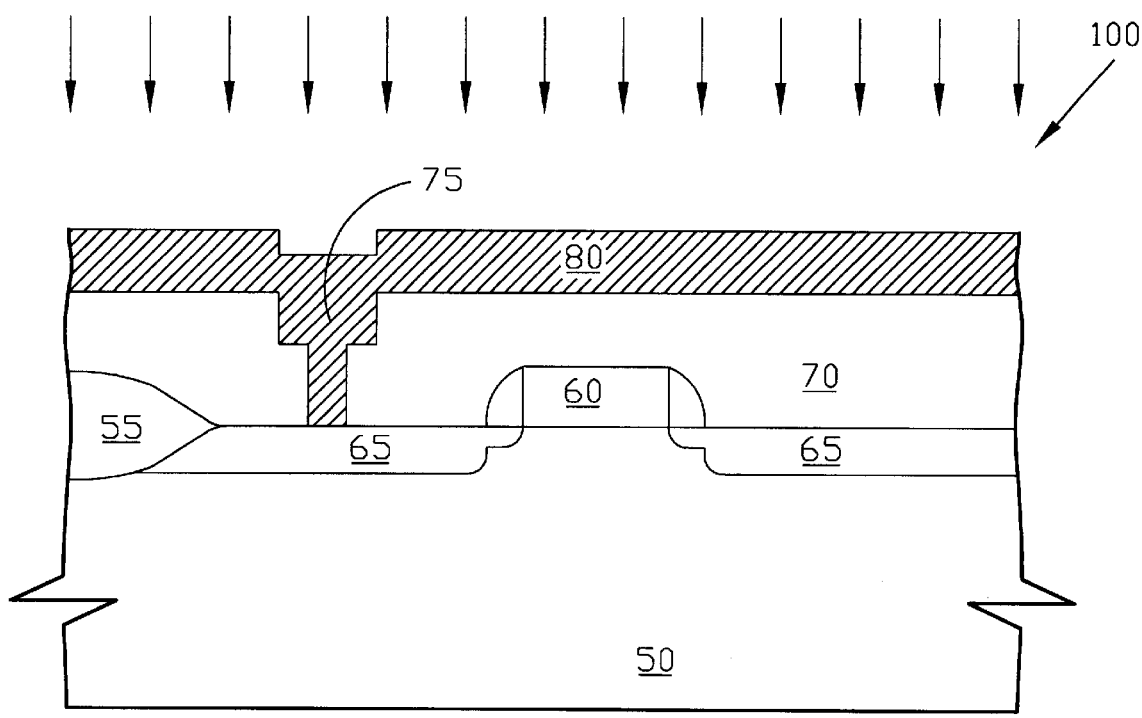
FIG. 4 is a cross-section view showing a semiconductor substrate after electroplating an electroplated copper layer and a $NH_3$ plasma annealing process of the present invention.

Referring to FIG. 4, a metal layer is formed on the SiO₂ layer 70 and the via 75 is filled with the metal layer by an electroplating process, wherein the preferred material is copper (Cu). The prevention of hillock type defects formation in the copper layer 80 will now be described. A $NH_3$ plasma process for annealing the copper layer 80 is performed by a plasma enhanced chemical vapor deposition (PECVD) or a high density plasma chemical vapor deposition (HDPCVD), the preferred example is plasma enhanced chemical vapor deposition, the HFRF power of the $NH_3$ plasma is about from 0.1 to 5 w/cm² and the LFRF power is about 0.05 to 0.5 w/cm²; and the temperature is at about 350° C. to 450° C., while the preferred temperature is 400° C., and the pressure is at about 0.1 Torr to 10 Torr, the preferred value is 2.6 Torr; and the operation time is about 30 seconds to 300 seconds, the preferred value is about 120 seconds.

Figure 1:
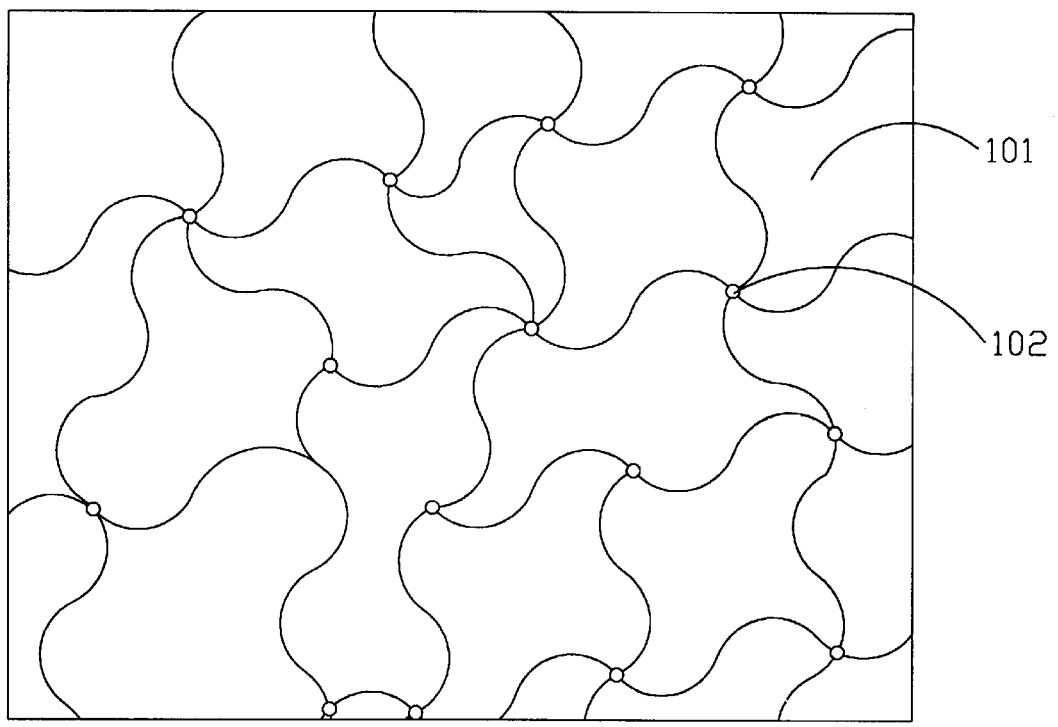
FIG. 1 is a sketch view showing the hillock type defects caused by using the conventional furnace annealing process.
Figure 2:
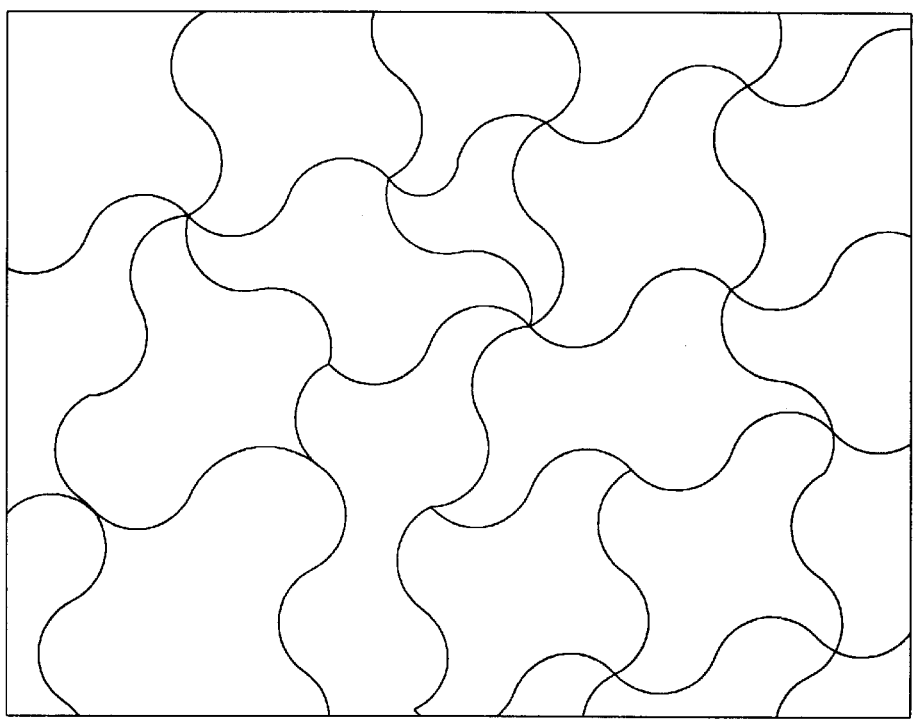
FIG. 2 is a sketch view showing there are no hillock type defects by using the present invention.

Referring to FIG. 2, the advantage of the present invention is using the $NH_3$ plasma annealing process to replace the conventional furnace post ECP copper annealing process, which can effectively suppress the formation of hillock type defects caused by the stress in the electroplated copper layer, and which can also reduce the pullouts and line voids caused by the follow-up process, furthermore, the present invention also provides a faster and more economical electroplated copper post annealing process compared to the conventional method due to the fact that the key operation time of the present invention is only about 30 seconds to 300 seconds, which is much less than the time of the conventional furnace post ECP copper annealing process.

Referring to table 1, the respective copper layer properties of different copper annealing process are described. It can be seen that sheet resistance measured from the present invention is 14.15 (mohm/sq), which is almost the same as the value 14.14 (mohm/sq) measured from the conventional furnace annealing process. Again, the relative reflectivity measured from the present invention is 1.412, which is almost the same as the value 1.414 measured from the conventional furnace annealing process. Therefore, we can prove that the copper layer properties after the $NH_3$ plasma annealing process are as good as those after conventional furnace annealing process. Furthermore, the key operation time needed in the present invention is only 2 minutes which is a great deal less than the 30 minutes needed for the conventional furnace annealing process, therefore, the present invention is a faster and more economical electroplated copper post-annealing process compared to the conventional method.

TABLE 1

| Condiction | Temp (° C.) | Time (sec) | Sheet resistance (mohm/sq) | Relative Reflectivity |
|---|---|---|---|---|
| As-electroplated Cu | | | 16.86 | 1.0119 |
| Furnace annealing | 300 | 30 | 14.14 | 1.141 |
| $NH_3$ plasma annealing | 400 | 2 | 14.15 | 1.142 |

What is claimed is:

1. A method for electroplated metal annealing process, said method comprising the following steps of:
    providing a semiconductor structure;
    forming a dielectric layer over the surface of said semiconductor structure;
    forming a via exposing part of said semiconductor structure in the said dielectric layer;
    electroplating a metal layer over the surface of said semiconductor substrate and filling up said via with said metal layer; and
    annealing said metal layer by a $NH_3$ plasma process.

2. The method according to claim 1, wherein said semiconductor structure comprises field oxide region, gate electrode, source and drain region.

3. The method according to claim 1, wherein said dielectric layer is selected from the group of SiO₂, TEOS (TetraEthyl-OrthoSilicate), BPSG (BoroPhosphoSilicate Glass).

4. The method according to claim 1, wherein said metal layer is selected from the group of copper (Cu), aluminum (Au), tungsten (Wu), titanium (Ti), tantalum (Ta) and the alloy of the above-mention metal.

5. The method according to claim 1, wherein said $NH_3$ plasma process is selected from one of the plasma enhanced chemical vapor deposition (PECVD) and high density plasma chemical vapor deposition (HDPCVD).

6. The method according to claim 5, wherein the HFRF power of the $NH_3$ plasma is about from 0.1 w/cm² to 5 w/cm², and the LFRF power is about 0.05 w/cm² to 0.5 w/cm².

7. The method according to claim 6, wherein said $NH_3$ plasma process is performed at about 350° C. to 450° C.

8. The method according to claim 7, wherein said $NH_3$ plasma process is performed at about 0.1 Torr to 10 Torr.

9. The method according to claim 8, wherein said $NH_3$ plasma process is performed at about 30 seconds to 300 seconds.

10. A method for electroplated metal annealing process, said method comprising the following steps of:

provide a semiconductor structure;

forming a SiO$_2$ layer over the surface of said semiconductor structure;

forming a via exposing part of said semiconductor structure in the said SiO$_2$ layer;

electroplating a metal layer over the surface of said semiconductor substrate and filling up said via with said metal layer; and annealing said metal layer by a NH$_3$ plasma process.

11. The method according to claim 10, wherein said semiconductor structure comprises field oxide region, gate electrode, source and drain region.

12. The method according to claim 10, wherein said metal layer is selected from the group of copper (Cu), aluminum (Au), tungsten (Wu), titanium (Ti), tantalum (Ta) and the alloy of the above-mention metal.

13. The method according to claim 10, wherein said NH$_3$ plasma process is selected from one of the plasma enhanced chemical vapor deposition (PECVD) and high density plasma chemical vapor deposition (HDPCVD).

14. The method according to claim 13, wherein the HFRF power of the NH$_3$ plasma is about from 0.1 w/cm$^2$ to 5 w/cm$^2$, and the LFRF power is about 0.05 w/cm$^2$ to 0.5 w/cm$^2$.

15. The method according to claim 14, wherein said NH$_3$ plasma process is performed at about 350° C. to 450° C.

16. The method according to claim 15, wherein said NH$_3$ plasma process is performed at about 0.1 Torr to 10 Torr.

17. The method according to claim 16, wherein said NH$_3$ plasma process is performed at about 30 seconds to 300 seconds.

18. A method for electroplated metal annealing process, said method comprising the following steps of:

providing a semiconductor structure;

forming a SiO$_2$ layer over the surface of said semiconductor structure;

forming a via exposing part of said semiconductor structure in the said SiO$_2$ layer;

electroplating a metal layer over the surface of said semiconductor substrate and filling up said via with said metal layer; and annealing said metal layer by a NH$_3$ plasma enhanced chemical vapor deposition (PECVD) process.

19. The method according to claim 18, wherein said semiconductor structure comprises field oxide region, gate electrode, source and drain region.

20. The method according to claim 18, wherein the HFRF power of the NH$_3$ plasma is about from 0.1 w/cm$^2$ to 5 w/cm$^2$, and the LFRF power is about 0.05 w/cm$^2$ to 0.5 w/cm$^2$.

21. The method according to claim 20, wherein said NH$_3$ plasma enhanced chemical vapor deposition process is performed at about 350° C. to 450° C.

22. The method according to claim 21, wherein said NH$_3$ plasma enhanced chemical vapor deposition process is performed at about 0.1 Torr to 10 Torr.

23. The method according to claim 22, wherein said NH$_3$ plasma enhanced chemical vapor deposition process is performed at about 30 seconds to 300 seconds.

* * * * *